United States Patent [19]

Bailey

[11] Patent Number: 5,256,566
[45] Date of Patent: * Oct. 26, 1993

[54] METHOD FOR IN-SITU DOPING OF DEPOSITED SILICON

[75] Inventor: Dane E. Bailey, Dallas, Tex.

[73] Assignee: Texas Instruments Incorporated, Dallas, Tex.

[*] Notice: The portion of the term of this patent subsequent to Oct. 31, 2006 has been disclaimed.

[21] Appl. No.: 697,635

[22] Filed: May 8, 1991

[51] Int. Cl.$^5$ .................. H01L 21/469; H01L 21/223
[52] U.S. Cl. ....................... 437/233; 437/81; 437/106
[58] Field of Search ...................... 437/165, 141, 233

[56] References Cited

U.S. PATENT DOCUMENTS

| 4,877,753 | 10/1989 | Freeman | 437/101 |
| 4,882,299 | 11/1989 | Freeman et al. | 437/233 |
| 5,096,856 | 3/1992 | Freeman | 437/959 |

FOREIGN PATENT DOCUMENTS

| 59-161080 | 9/1984 | Japan . |
| 63-072154 | 1/1988 | Japan . |
| 63-216381 | 9/1988 | Japan . |
| 1-013732 | 1/1989 | Japan . |
| 2-028361 | 1/1990 | Japan . |
| 2-049475 | 2/1990 | Japan . |
| 2-188498 | 7/1990 | Japan . |
| 2-208293 | 8/1990 | Japan . |

OTHER PUBLICATIONS

Wolf et l. "Silicon Processing for VLSI Era" pp. 264-265 (1986).
T. Tang, "In-Situ Doped Polysilicon Using Vapor Dopant for High Density DRAMs", Semiconductor Process and Design Center, Texas Instruments Incorporated, IEDM Tech. DIG., 39 (1989).
K. Sawada, et al., "Formation of Polysilicon Electrodes in Deep Trenches with Two-Step Continuous Deposition of In-Situ Doped and Undoped Poysilicon Films", Matsushita Elec. Ind. Co., Ltd., 3-15 Yagumo-nakamachi Moriguchi Oska 570, Japan, p. 4142 (date unknown).
A. Learn, et al., "Deposition and Electrical Properties of In-Situ Phosphorus-Doped Silicon Films Formed by Low-Pressure Chemical Vapor Deposition" J. Appl. Phys. vol. 61, No. 5, Mar. 1987.

Primary Examiner—O. Chaudhuri
Assistant Examiner—Ramamohan Rao Paladugu
Attorney, Agent, or Firm—Gary C. Honeycutt; Richard L. Donaldson; William E. Hiller

[57] ABSTRACT

A method for in-situ doping of deposited silicon is disclosed. The method utilizes low temperature of approximately 560° C., low pressure of approximately 300 mTorr, and low phosphine to silane ratio of approximately 0.0008 to form phosphorus doped silicon. The method is manufacturable in an automated LPCVD reactor. It allows relatively uniform defect free silicon films of low resistivity and good conformality and step coverage to be deposited at sufficient deposition rates over large semiconductor wafer lots for high wafer throughput.

17 Claims, 13 Drawing Sheets

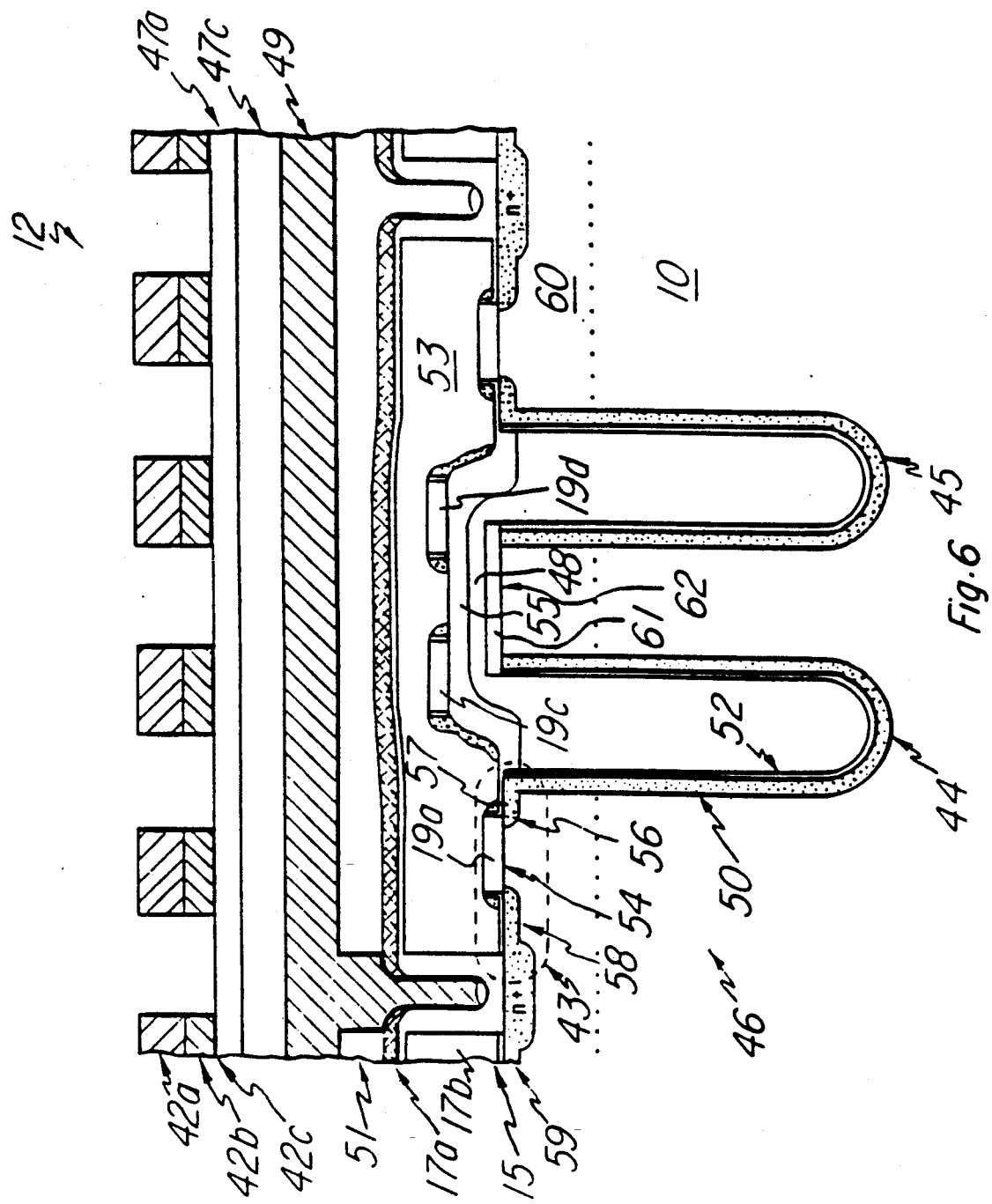

METHOD FOR IN-SITU DOPING OF DEPOSITED SILICON

FIELD OF THE INVENTION

This invention relates to integrated semiconductor devices and more specifically to the deposition of doped semiconductor material.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al, (a trench capacitor cell).

Modern fabrication of VLSI devices like DRAMs makes wide use of deposited films on semiconductor wafers. Deposited films have many uses, such as conducting regions within the device, electrical insulation between metals, and protection from the environment. One of the materials most often deposited is polycrystalline silicon. Among other uses, it may be used as the gate electrode material in MOS devices, as a conducting material for multilevel metallization, and as a contact material for devices with shallow junctions. Deposition gases may be pyrolyzed in a low pressure chemical vapor deposition, LPCVD, reactor to form doped silicon films. U.S. Pat. No. 4,877,753, issued Oct. 31, 1989, assigned to Texas Instruments Incorporated and incorporated herein by reference discloses in-situ doping of polysilicon using tertiary butyl phosphine. The copending and coassigned patent application of coinventor Tang filed Dec. 1, 1989 entitled "Method and Apparatus for In-Situ Doping of Deposited Silicon", Ser. No. 07/444,900, incorporated herein by reference, discloses using deposition gases of silane $SiH_4$ and tertiary butyl phosphine, TBP, $(C_4H_{11})P$ in a LPCVD reactor to form doped amorphous films. LPCVD techniques allow for potential advantages in uniform step coverage, precise control of composition and structure, low temperature processing, fast deposition rates, high throughput, and low processing costs. The copending and coassigned application of the inventor herein and of Tang filed Oct. 31, 1990 entitled "A Vertical LPCVD Reactor", U.S. Pat. No. 5,076,206 incorporated herein by reference discloses an improved LPCVD vertical reactor used to form doped polysilicon films.

As trench capacitor cell DRAMs move into the 16M and 64M size, the aspect ratios of the trenches (the trench depth divided by the trench width) become large as trench widths decrease to submicron levels. In such devices, new processes are needed for forming in-situ doped silicon films. The films must be not only uniform and defect free, but also highly conformal. Resistivity variations should be minimal. The process should also allow sufficient throughput of wafers.

Accordingly, it is the object of this invention to provide a method of forming in-situ doped silicon films with improvements in conformality and resistivity.

It is a further object of this invention to provide such a method that yields uniform films with reduced defects.

It is a further object of this invention to provide such a method that is suitable for high volume processing of semiconductor wafers.

Other objects and advantages of this invention will be apparent to those of ordinary skill in the art having reference to this specification together with the drawings.

SUMMARY OF THE INVENTION

These problems are solved by the method of the invention for in-situ doping of deposited silicon. A dopant source such as phosphine and silane are chemically vapor deposited at low temperature and low pressure. The phosphine/silane ratio is very small. The process may be practiced in an automated LPCVD reactor wherein the temperature is about 560° C. and the pressure is about 300 mTorr. The phosphine PH3 to silane SiH4 ratio is about 0.0008. Having this configuration, the process deposits uniform, conformal, low resistive, and defect free in-situ doped silicon films over large numbers of semiconductor wafers at deposition rates fast enough for VLSI requirements. The process is particularly suited for forming in-situ doped polysilicon films having good step coverage in high density trench capacitor type memory devices.

BRIEF DESCRIPTION OF THE DRAWINGS

FIG. 6 is a side view of the memory cells.

DETAILED DESCRIPTION OF THE PREFERRED EMBODIMENT

Figure 1:
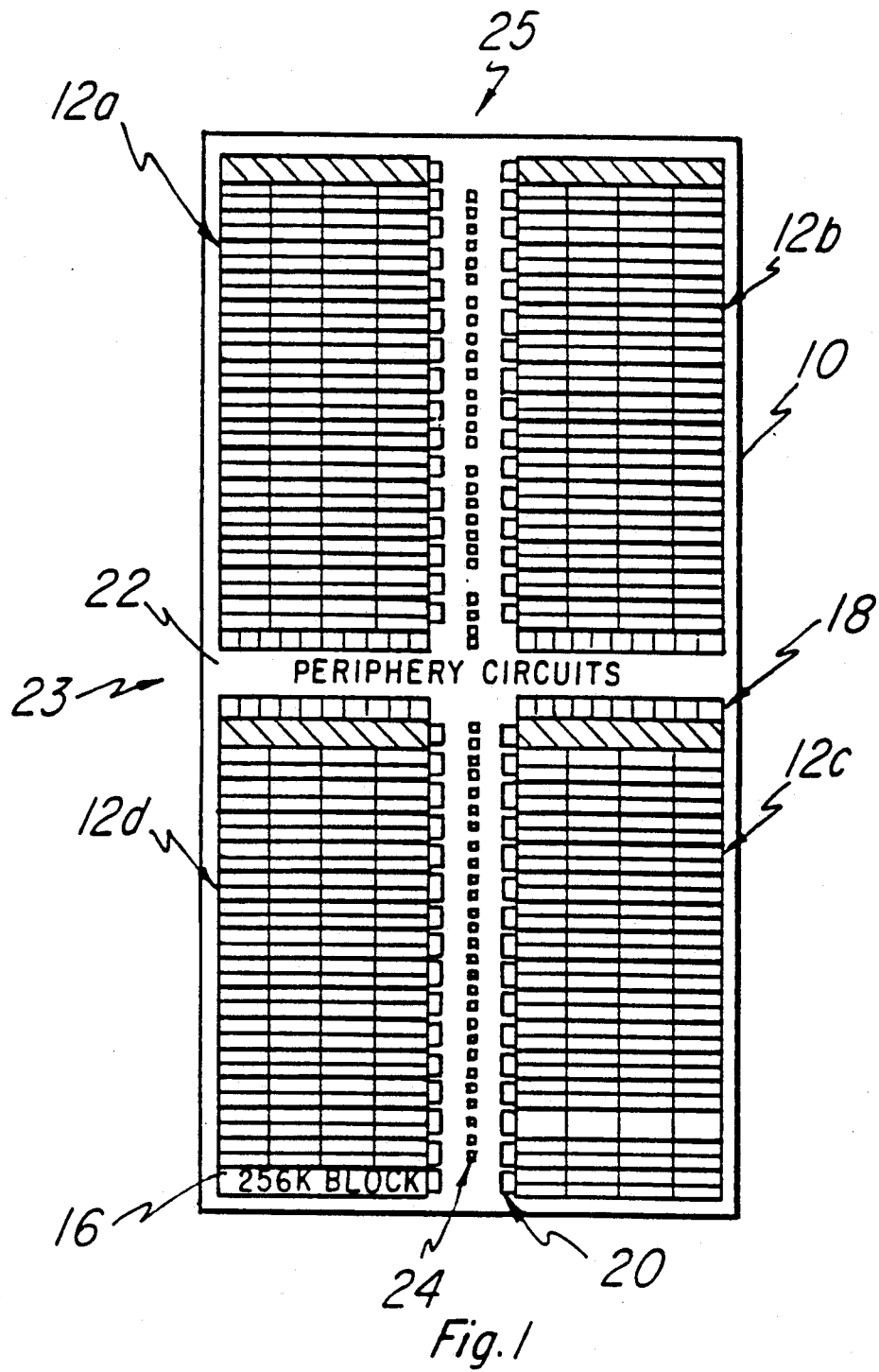
FIG. 1 is a block system level drawing illustrating a semiconductor integrated circuit device on a substrate incorporating the preferred embodiment of the invention.

Referring to FIG. 1, the in-situ doped silicon process of the invention may be used in forming films in a silicon semiconductor substrate chip 10 having a dynamic random access memory array 12 in a face thereof formed otherwise generally by a CMOS submicron process as disclosed in coassigned U.S. Pat. No. 5,017,506. The DRAM circuitry may be, for example, a 16 Megabit Dynamic Random Access Memory. The memory array 12 is partitioned into four memory quadrants 12a-12d of 4 Megabits each lying in the active face of semiconductor chip 10. Each memory quadrant 12a-12d contains sixteen memory blocks 16 of 256 Kilobits each. Each memory block 16 contains 1024 bit lines 17, or columns, contains 1024 sense amplifiers, and has 256 word lines 19, or rows. (The bit lines, word lines, and sense amplifiers are not illustrated in FIG. 1 for clarity.) The column decoders 18 lie along the vertical axis 23 of the chip adjacent to their respective memory array quadrants. The row decoders 20 lie along the horizontal axis 25 of the chip adjacent to their respective memory array quadrants. The periphery circuits 22, containing such devices as the input and output buffers and the timing and control circuits, are formed in the periphery of the substrate and are centrally located along the vertical axis of the chip while the bond pads 24 are centrally located along the horizontal axis of the chip. Although not illustrated in FIG. 1 for clarity, the DRAM receives addresses signals A0-A11 and its operation is controlled by the standard signals Row Address Strobe RAS_, Column Address Strobe CAS_, and Write Enable W_. The size of semiconductor chip 10 is about 327×660 mils.

Figure 2:
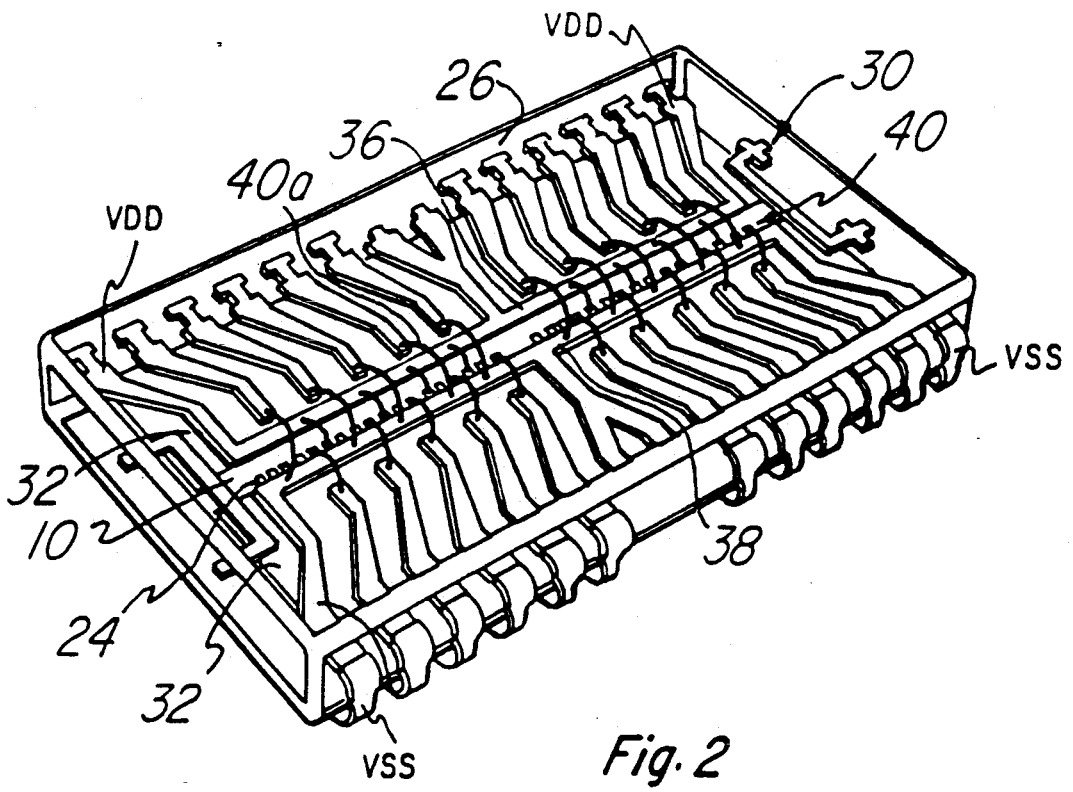
FIG. 2 is a three dimensional view of the packaged, encapsulated, semiconductor integrated circuit device wherein the encapsulant is rendered transparent.
Figure 3:
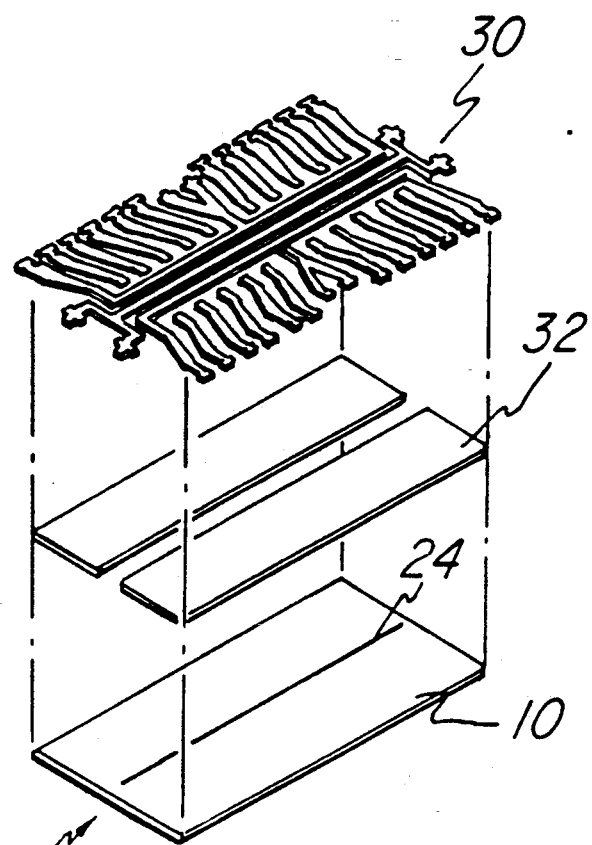
FIG. 3 is a partial assembly view of FIG. 2.

FIG. 2 depicts a three dimensional view of the encapsulated chip 10 wherein the encapsulant 26 is rendered transparent while FIG. 3 presents an assembly view. The chip 10 is encapsulated in a thin plastic small outline J-type package of the lead over chip center bond (LOCCB) type. The chip 10 underlies the lead frame 30. Two strips of polyimide tape 32 attach the chip 10 to the lead frame 30. The two strips of tape 32 are positioned along the horizontal axis 25 of chip 10 on opposite sides of the bond pads 24 leaving the bond pads uncovered and exposed. When assembled, the bond pads 24 lie between the Vdd power supply bus 36 and the Vss power supply bus 38 of the lead frame 30. Various wire bonds 40 attach the Vdd power supply bus 36 and the Vss power supply bus 38 to various of the bond pads 24 allowing multiple connections from the power supply busses to the semiconductor chip 10. Other wire bonds, such as wire bond 40a, cross over the power supply busses and attach the lead fingers 40 to the bond pads 24. These crossing wire bonds do not touch the power supply busses and no shorting occurs. The size of the encapsulated package is about 400×725 mils.

Figure 4:
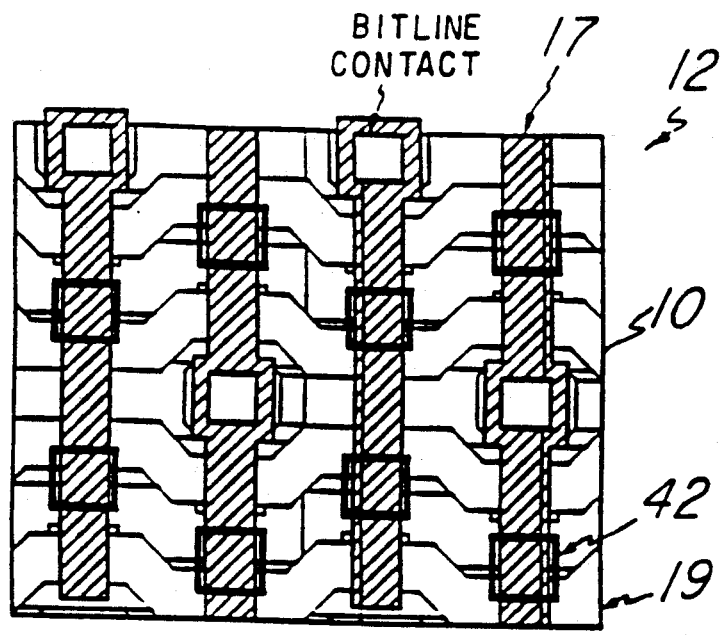
FIG. 4 is a top view of a portion of the memory array layout of the semiconductor integrated circuit device.

FIG. 4 is a top view of a portion of memory array 12. The memory cells of memory array 12 are of the modified trench capacitor type obtained through submicron technology. The dimensions of the memory array include a 1.6 um bit-line pitch by a 3.0 um double word line pitch with a cell size of about 4.8 um². The trench capacitor opening 42 is about 0.8 um×0.8 um. The bit lines 17 are polycide ($TiSi_2$) and are triple twisted for improved noise immunity. The word lines 19 are polysilicon and are strapped every 64 bits.

Figure 5:
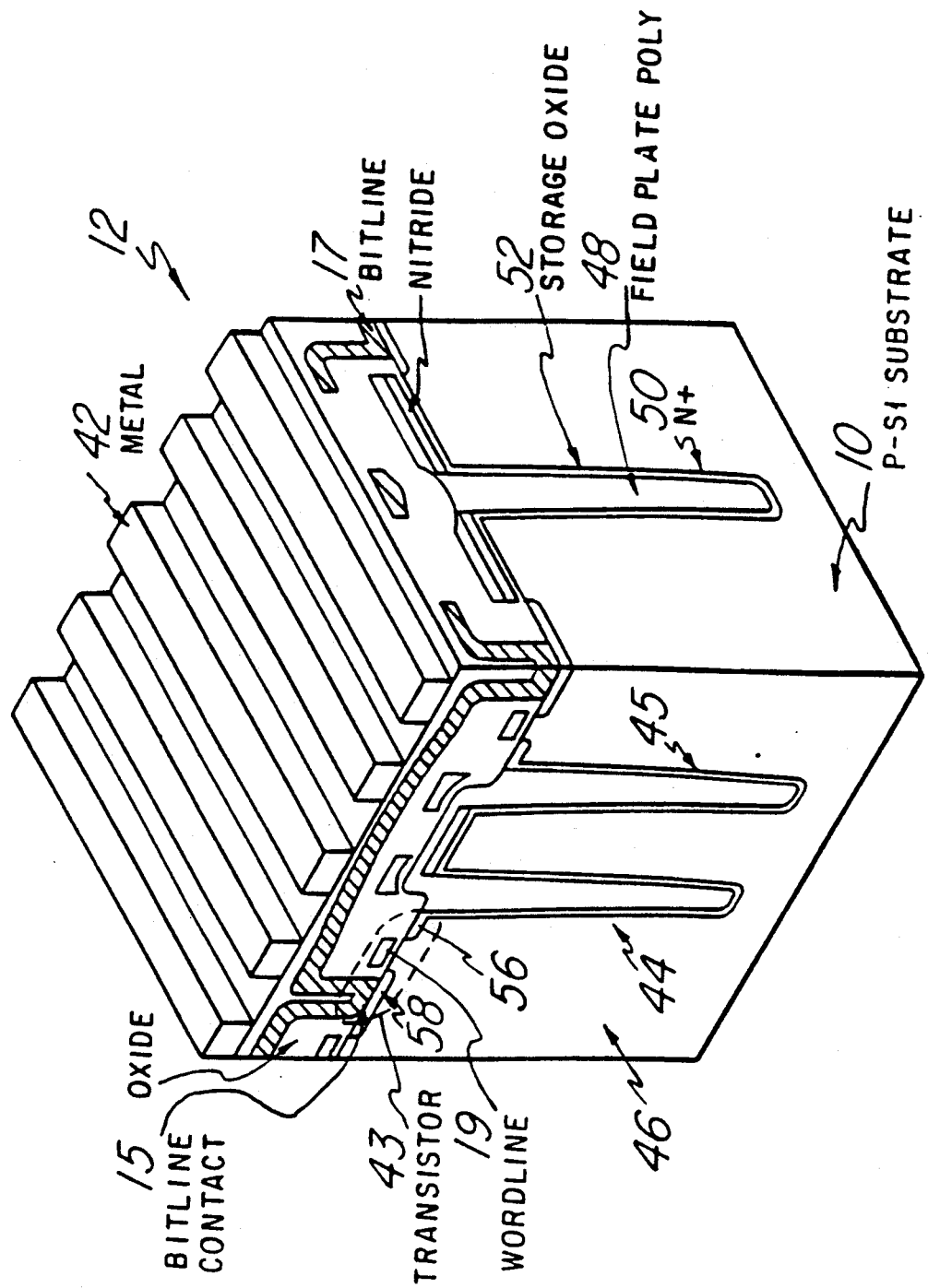
FIG. 5 is a cross sectional view of the memory cells of the memory array.

FIG. 5 presents a three dimensional view of a portion of the memory array 12 while FIG. 6 presents a cross section view. A three layer interconnect metal 42, Metal-2, accomplishes word line strapping. It has a top level 42a of Al-Si-Cu sputtered onto a middle level 42b of CVD W about 3500Å thick that overlies the bottom level 42C of sputtered TiW about 500Å thick. Oxide layer 47, lying beneath metal-2, is a metal interlevel oxide, MILO-2, of three layers: a top MILO level 47a of PECVD TEOS oxide about 3500Å thick; a middle level 47b, unillustrated, of spin on glass, SOG; and, a lower MILO-2 level 47c of PECVD TEOS oxide about 7000Å thick. A multi level interconnect metal 49, Metal-1, lying beneath MILO-2 level 47 accomplishes contacts to bit lines. A multilevel oxide layer 51, MLO, lies below interconnect metal 49 to provide isolation between the silicided Poly-3 bitlines 17 and Metal-1. The bit lines 17 comprise a layer of titanium 17a overlying a layer of polysilicon 17b. A bit line oxide layer 53, BLO, lies beneath the bit lines 17 and lies over the Poly-2 word lines 19. The poly-2 word lines 19 are about 0.6 microns wide. Poly-2 word line 19a forms the gate of pass transistor 43. It is separated from the substrate 10 by a Gate-2 oxide layer 54 about 150Å thick. Poly-2 word lines 19c and 19d, (poly-2 denotes that this is a second level of polysilicon in the memory device), pass over the top trench capacitors 44 and 45 and connect to other trench capacitors not shown. They are separated from the Poly-1 field plate 48 by an interlevel oxide layer 55, ILO, of thermally grown oxide. The Poly-1 field plate 48 is about 3000Å thick and is exemplary of the type of in-situ doped polysilicon film that may be manufactured by the preferred embodiment of the invention. The poly-2 word lines 19 have side walls 57 of deposited nitride-2. Phosphorus N+ implant layer 59 lies in the P− tank 60 of semiconductor wafer 10, located underneath the bit line contacts 15, and located between word line 19a and trench capacitor 44. The phosphorus layer 59 thus forms the source 56 and the drain 58 of the pass gate transistor 43. Underneath the poly-1 field plate 48, between the trench to trench space separating trench capacitors 44 and 45, lies a nitride layer 61, nitride-3, about 1300Å thick. Between Nitride-3 layer 61 and P-tank 60 lies an oxide layer 62, pad ox-3, containing about 300Å of oxide. It acts as a buffer layer between the silicon substrate 10 and the nitride-3 layer 61 and as part of the field plate isolating dielectric. The trench capacitors 44 and 45 extend through the P-tank 60 into the P substrate of the silicon wafer 10. On the outside of the trench capacitor walls, is an implanted layer 50 of arsenic. Arsenic layer 50 creates the N+ storage node of the trench capacitors. The trench capacitor walls contain a gate dielectric 52, gate ox-1, that acts as a dielectric layer between the arsenic trench wall implant and the poly-1 field plate 48. An oxide layer covers a thin nitride layer to form the gate dielectric layer 52. Transfer transistor 43 and trench capacitor 44 comprise memory cell 46.

Figure 7:
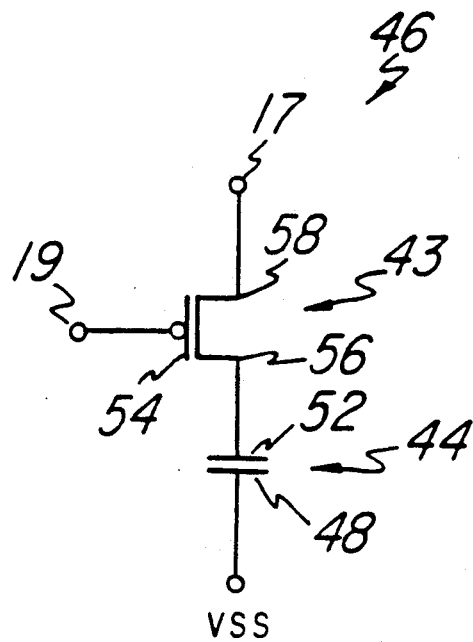
FIG. 7 is an electrical schematic diagram of a memory cell.

FIG. 7 is an electrical schematic diagram showing the electrical operation of transfer transistor 43 and trench capacitor 44. When data is to be stored on memory cell 46, the data is placed on bit line 17 and a high voltage signal (approximately 3.3 volts) is placed on gate 54. The voltage placed on bit line 17 is passed via source 56 to storage dielectric 52. Field plate 48 is tied to a reference potential Vss, ground, and thus a charge representing the voltage applied by bit line 17 is stored on storage dielectric 52. To store the data on storage dielectric 52, the positive voltage is removed from gate 54 thus stopping continuity between source 56 and drain 58.

Figure 8:
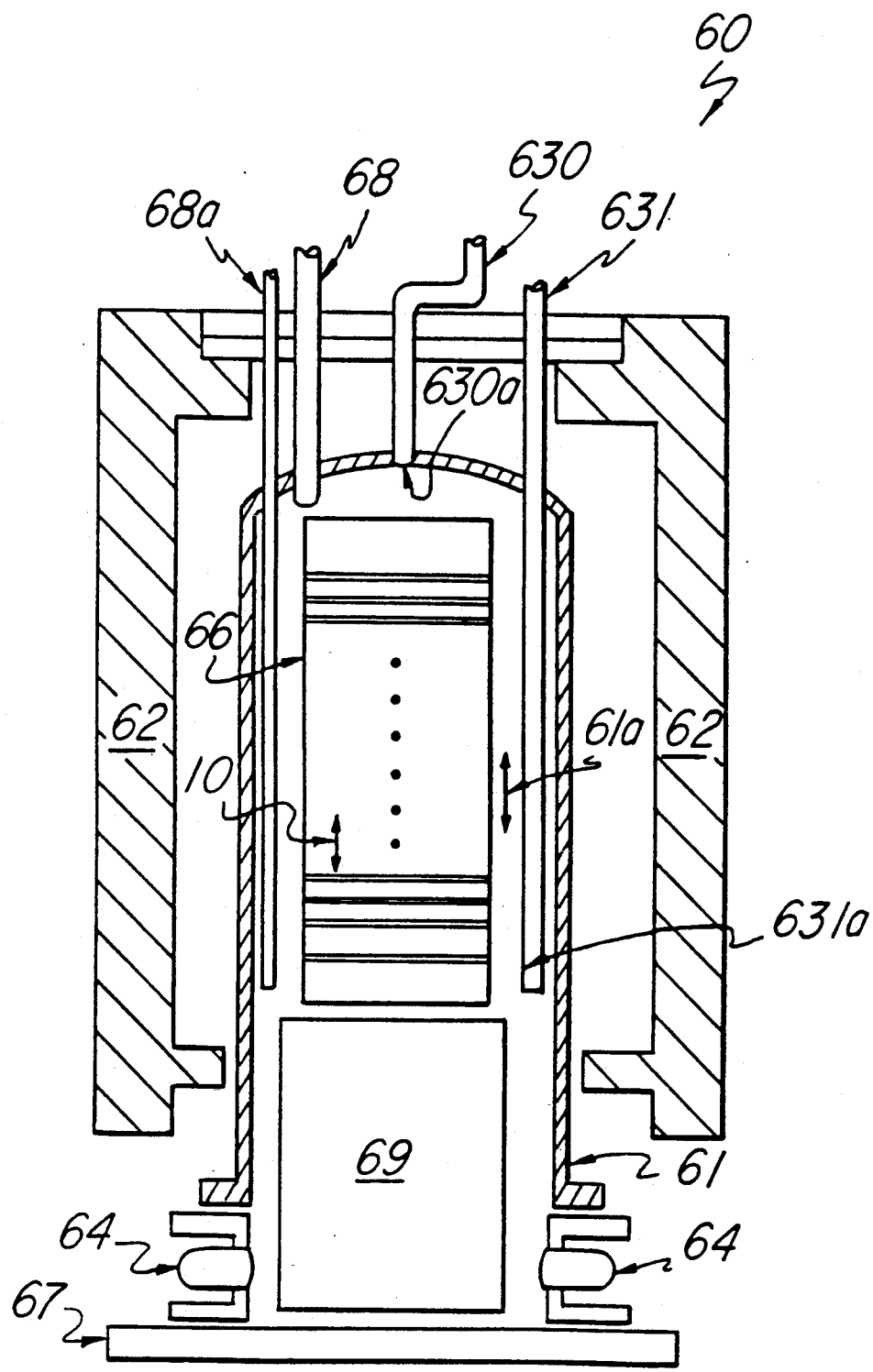
FIG. 8 is a cross sectional block diagram of a fully automated Vertical Low Pressure Chemical Vapor Deposition, LPCVD, reactor.

FIG. 8 is a block diagram of a fully automated vertical LPCVD reactor suitable to form in-situ doped polysilicon films according to the process of the invention. Thermco Systems, a division of Silicon Valley Group, Inc., manufactures such a vertical reactor. The vertical reactor 60 has a vertically positioned bell shaped quartz tube 61 about forty three inches in length. Vertical reactor 60 is about fifty inches long. The inside of quartz tube 61 forms the reaction chamber, process chamber, 61a. The inside top belled end of quartz tube 61 presents the top of reaction chamber 61a. Resistive heated furnace element 62 provides heat. The portion of vertical reactor 60 heated by 62 is referred as the "heat zone" of the reactor.

In FIG. 8, the deposition gases are introduced into the reaction chamber 61a through two sources: top gas inlet 630a of top gas tube 630; and, bottom gas inlet 631a of bottom gas tube 631. A pump, not illustrated, connected to the dual flange plenum 24 draws the deposition gases out of the process chamber 21a.

In FIG. 8, the semiconductor wafers 10 lie above one another in horizontal position in the quartz wafer carrier 66. Quartz wafer carrier 66 carries about 80 150 mm semiconductor wafers. Wafer location one in the quartz wafer carrier 66 is in the upper portion of wafer carrier 66 near the top of the reaction chamber while wafer location eighty in is in the lower portion of wafer boat 66 next to quartz pedestal 69. Quartz wafer carrier 66 rests upon quartz pedestal 69. The quartz pedestal 69 and the wafer carrier 66 are loaded into the process chamber 61a through the load door 67 at the bottom of vertical LPCVD reactor 60. A pressure sensor, not illustrated, connected to pressure sensor tube 68 monitors the pressure and a temperature sensor, not illustrated, attaches to temperature sensor tube 68a to monitor temperature.

The advantageous preferred embodiment of forming in-situ doped silicon films is now described. A phosphorus dopant and silane (SiH4) reaction forms in-situ doped silicon films. The invention may be practiced in a LPCVD reactor. The reactor of FIG. 8 is suitable to obtain high wafer throughput. In the method of the invention, the temperature within the heat zone of the reactor is relatively low, between the range of 540° to 570° C., with about 560° C. being optimal. The pressure is low, between the range of 200 to 400 mTorr, with about 300 mTorr being optimal. The phosphorus dopant source is preferably phosphine PH3 and the phosphine to silane ratio PH3/SiH4 is low, on the order of about 0.0008. The top gas flow through tube 630 is approximately 300 sccm and the bottom gas flow through tube 631 is approximately 250 sccm. The LPCVD reaction of PH3/SiH4 under these low temperature and low pressure conditions yields suitable in-situ doped silicon films. The amorphous-polysilicon transition temperature for this process is approximately 550° C.

Figure 10:
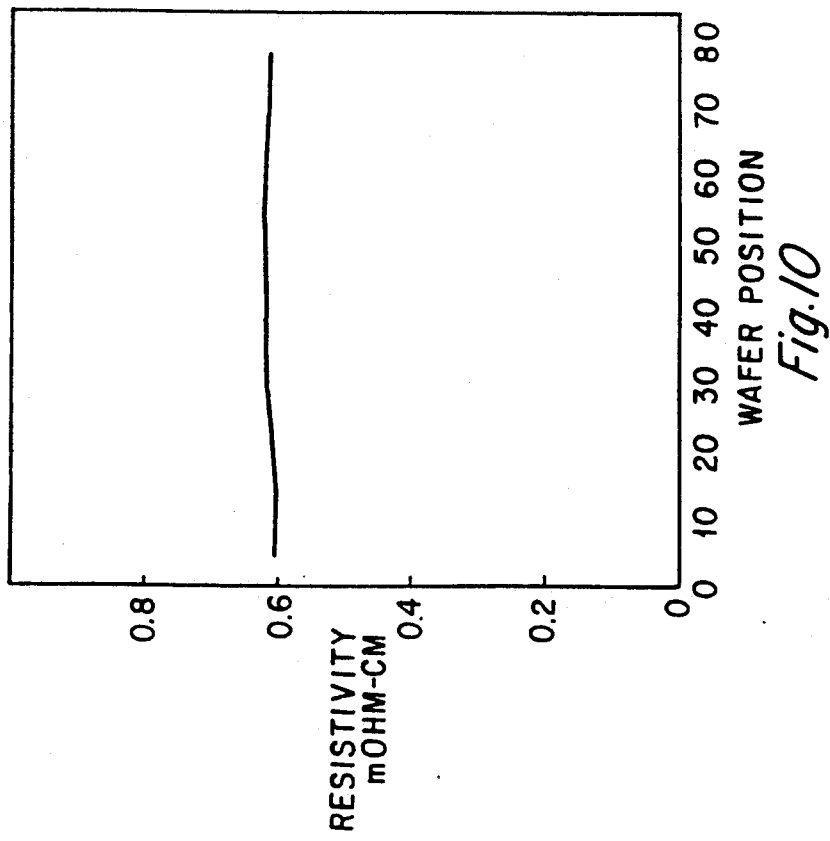
FIG. 10 is a graph illustrating resistivity vs. wafer position in a reactor using the method of the invention.
Figure 9:
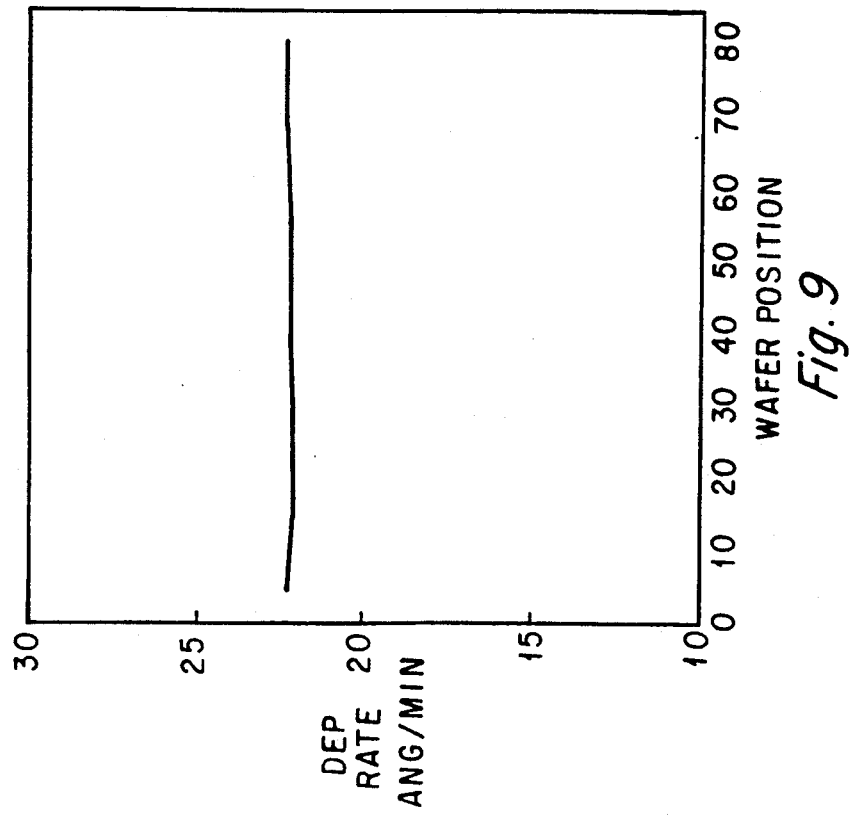
FIG. 9 is a graph illustrating deposition rate vs. wafer position in a reactor using the method of the invention.

FIG. 9 is a graph illustrating deposition rate vs. wafer position in the wafer carrier 66 of FIG. 8 when practicing the preferred embodiment of the invention with about 75 semiconductor wafers loaded into the quartz wafer boat of the reactor. A uniform deposition rate of about 22.2 angstroms per minute is achieved. FIG. 10 is a graph illustrating resistivity vs. wafer position in the wafer carrier 66 when practicing the invention. An advantageous uniform low resistivity of about 0.6 mOHMS—centimeter is achieved over the wafers in the reaction chamber. Film thickness and resistivity have about a one sigma variation of approximately 1.15% and 1.9% respectively. Additional uniformity may be achieved by slightly tilting the temperature within the reactor so that the top zone of the reactor is about +2° C. and the bottom zone of the reactor is about −4° C.

Experimental design was employed to optimize the effects of gas flow, pressure, and PH3/SiH4 ratio with regard to film thickness uniformity and resistivity uniformity in obtaining the process of the invention. Lots containing seventy semiconductor wafers each were ran in a vertical LPCVD reactor. The temperature within the reactor was held at approximately at 560° C. for all lot runs. Prior to film deposition, about 80–100 nm of silicon dioxide was thermally grown on the wafers. The silane gas flow in the phosphorus dopant source was phosphine and the phosphine to silane PH3/SiH4 ratio was varied between 0.0008 to 0.002. The pressure was varied between about 300 to 600 mTorr. Polysilicon film thickness measurements were made with a Nanospec using a refractive index of 2.8 after the semiconductor wafers were annealed at 1000° C. for 30 seconds in a Heatpulse RTA. Sheet resistance measurements were made with a Prometrix Omni Map. Defect densities were measured on as-deposited films using a WIS-8500 that is capable of 0.2 micron minimum resolution on unpatterned films.

Figure 12:
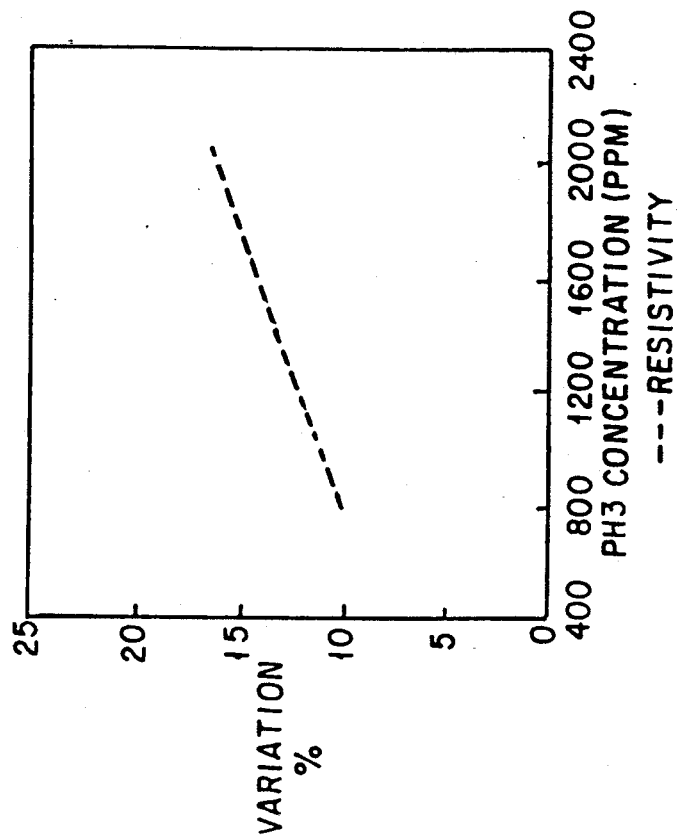
FIG. 12 is a graph illustrating resistivity variation vs. phosphine concentration.
Figure 11:
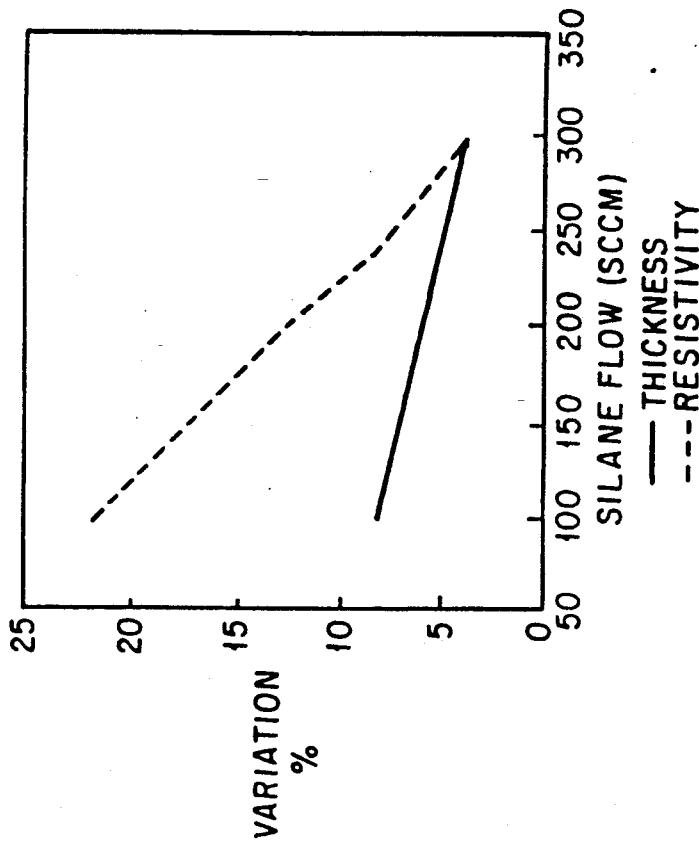
FIG. 11 is a graph illustrating film thickness and resistivity variation vs. silane flow.
Figure 13:
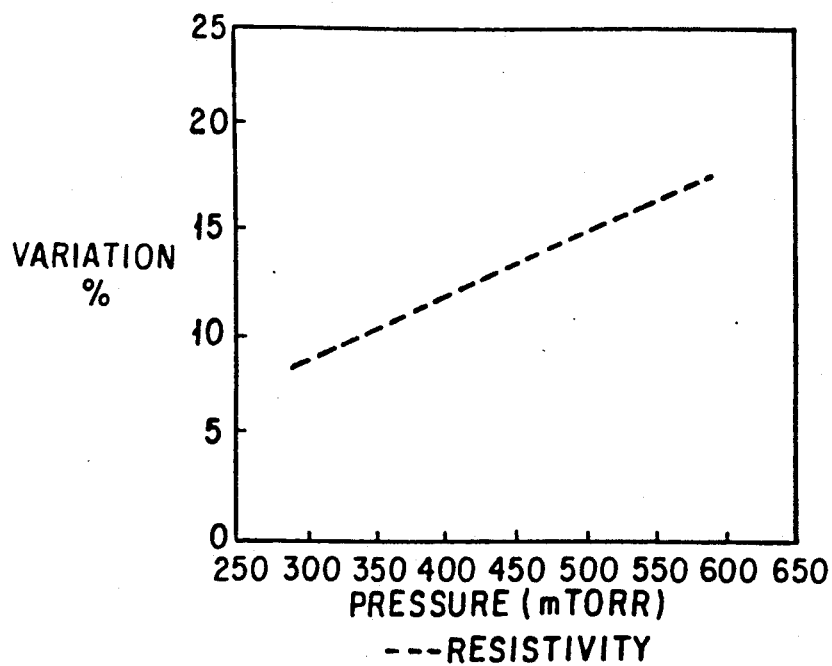
FIG. 13 is a graph illustrating resistivity variation vs. pressure.

FIG. 11 is a chart depicting the obtained results of film thickness percent variation and film resistivity percent variation vs. silane flow. FIG. 12 is a chart depicting the obtained results of film resistivity percent variation vs. phosphine concentration. FIG. 13 is a chart depicting the obtained result of film resistivity percent variation vs. pressure within the reactor.

As shown in FIGS. 11, 12, and 13, thickness and resistivity variation is inversely proportional to total gas flow. Resistivity variation is proportional to pressure and PH3/SiH4 ratio. The effects of pressure and PH3/SiH4 ratio on thickness variation were negligible. Referring back to FIGS. 9 and 10, deposition rate and uniformity of deposited polysilicon films are significantly improved as PH3 content is decreased.

Figure 14:
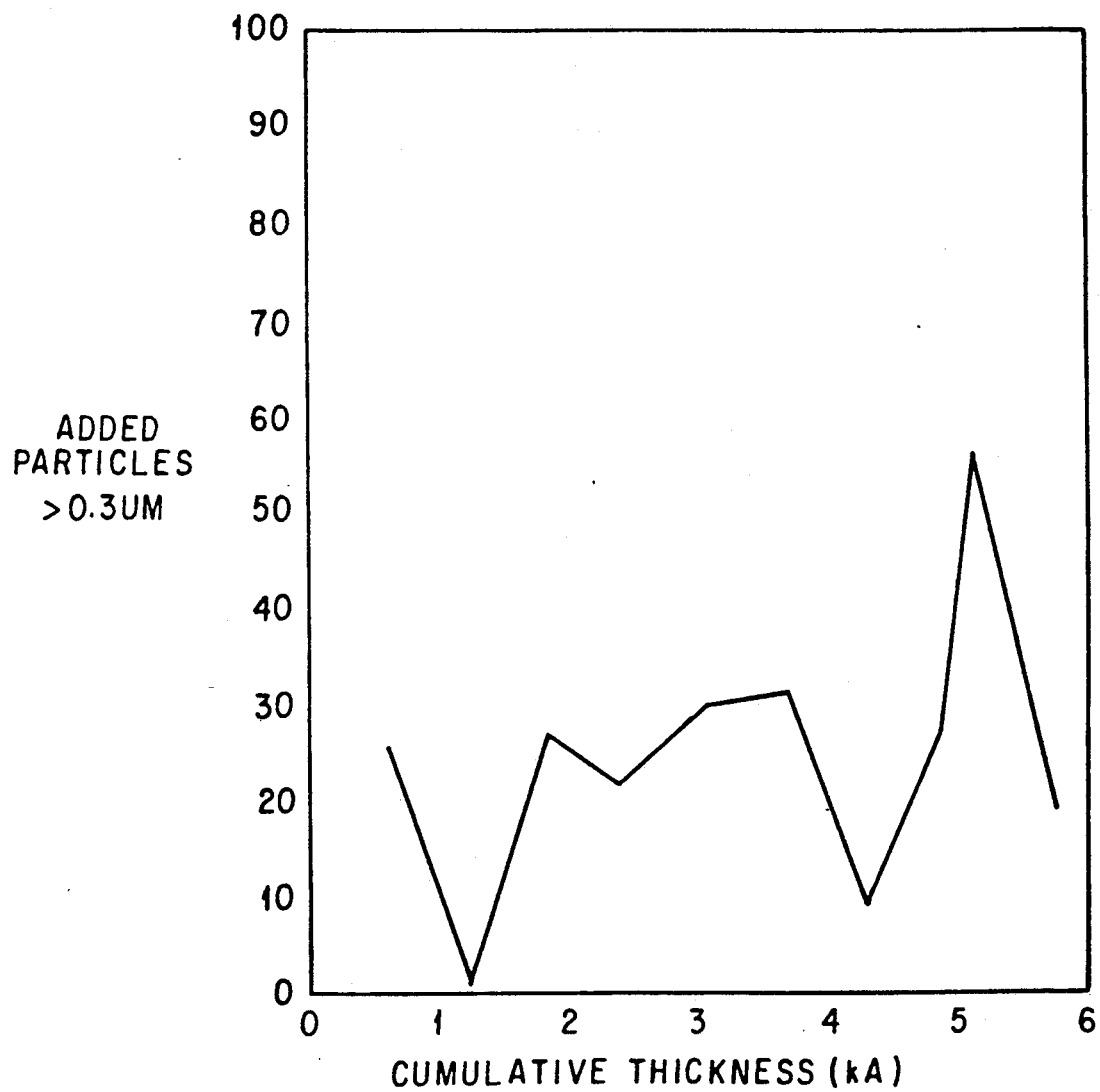
FIG. 14 is a graph illustrating added particles vs. cumulative film thickness using the method of the invention.

FIG. 14 is a chart illustrating added particles vs. cumulative thickness for the preferred embodiment of this process in forming in-situ doped polysilicon films. This graph shows that the method is capable of producing films with defect levels less than 0.17 defects/cm$^2$ for defect sizes greater than or equal to 0.3 microns.

In other experiments, the in-situ doped process of the invention was ran with the temperature in the LPCVD vertical reactor being varied between 550° to 600° C. The phosphine to silane ratio was 0.0008 and the pressure was 300 mTorr.

Figure 15:
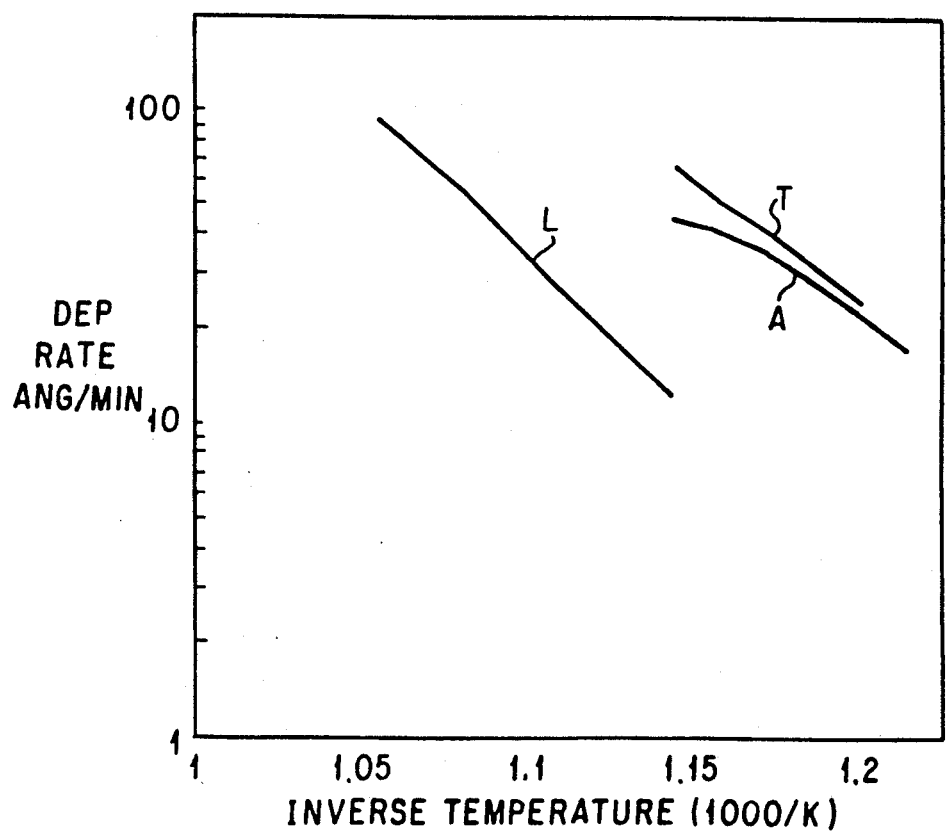
FIG. 15 is a Arrhenius plot showing the deposition rate for various in-situ deposited polysilicon films as a function of temperature.

FIG. 15 is an Arrhenius plot illustrating the obtained results on line A of deposition rate vs. deposition temperature. The results of line A show that the deposition rate of in-situ doped silicon films is proportional to the deposition temperature. The activation energy, as calculated from FIG. 15, is 1.5 eV as compared with an activation energy of 1.5 ev for TBP doped silicon (line T) as reported by Tom Tang in the article entitled "In-Situ Doped Polysilicon using Vapor Dopant for High Density Drams" appearing in IEDM Tech. Dig. 39 (1989), and as compared with an activation energy of 2.0 eV for high PH3/SiH4 concentrations (line L) as reported by Learn et al. in Journal of Appl. Phys. 61, 1898 (1987).

Figure 16:
FIG. 16.0 through 16.3 depict TEM micrographs of as-deposited films respectively at 550° C., 560° C., 570° C. and 600° C.

FIGS. 16.0-6.3 depict representations of Transmission Electron Microscopy, TEM, micrographs of the resulting as-deposited films over the temperature range of 550° to 600° C. as compared against a reference size of 0.5 microns FIG. 16.0 corresponds to the temperature of 550° C. The in-situ doped film at this temperature is essentially amorphous. The amorphous-polysilicon transition temperature for this process is approximately 550° C. FIG. 16.1 corresponds to the temperature of 560° C. The grain size is about 3000 angstroms. FIG. 16.2 corresponds to the temperature of 570° C. The grain size is about 2000 angstroms. FIG. 16.3 corresponds to the temperature of 600° C. The grain size is about 300 angstroms.

Figure 17:
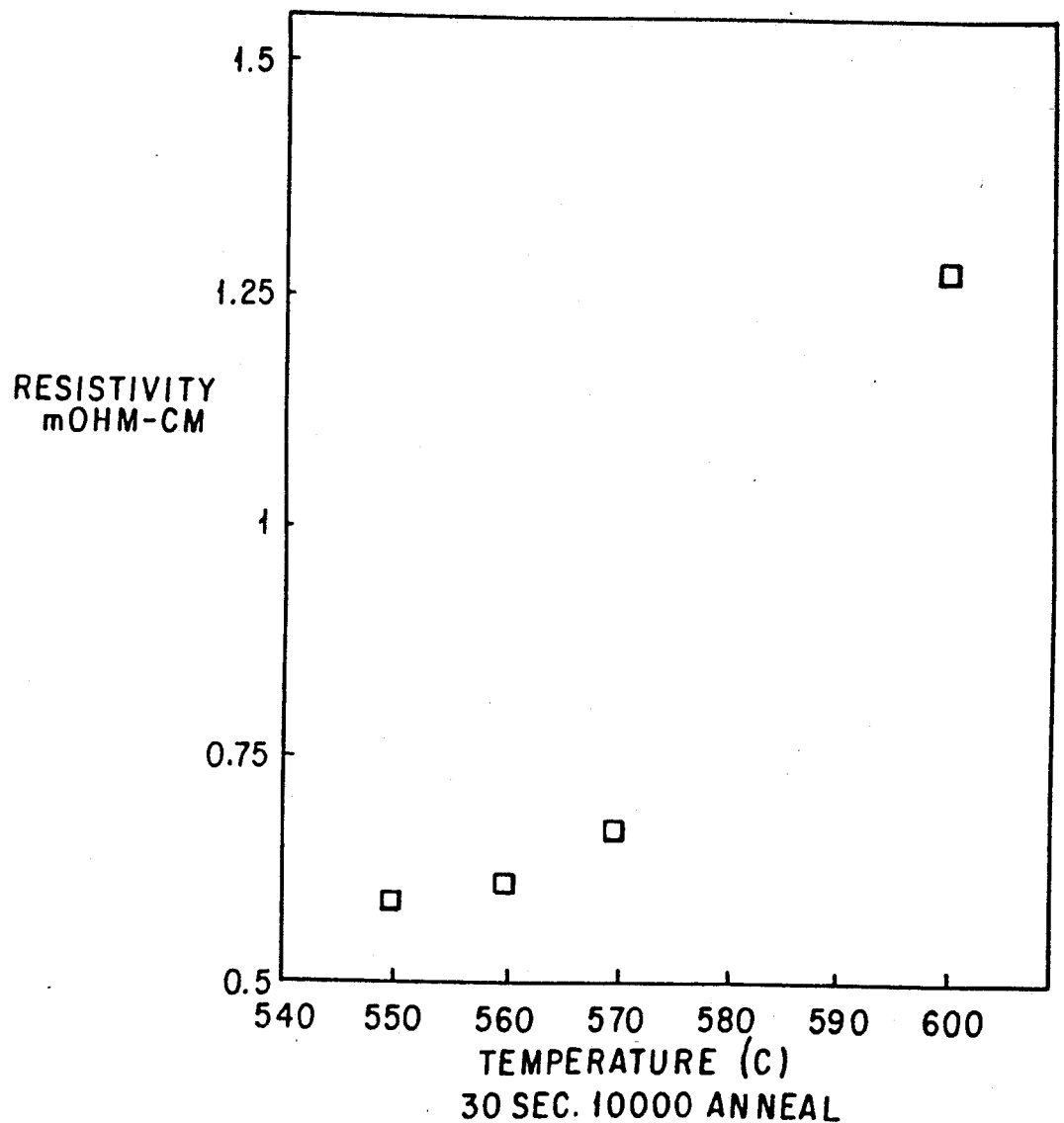
FIG. 17 is a graph illustrating the resistivity of the deposited films of FIG. 16 after a 30 second 1000° C. anneal.

FIG. 17 is a graph of the obtained results illustrating resistivity for the process over the temperature range of 550° to 600° C. This graph illustrates that the resistivity of the deposited films after annealing is proportional to the deposition temperature.

In practicing the invention to form the polysilicon field plate 48 of FIG. 6 for a memory device, the semiconductor wafer 10 would be previously processed to the point where the trenches have been etched into the silicon substrate as described in the coassigned U.S. Pat. No. 5,017,506. The wafer 10 would be placed in a LPCVD reactor. Then, using the low pressure, low temperature flow of the invention with temperature approximately 560° C., pressure approximately 300 mTorr, and phosphine to silane ratio PH3/SiH4 approximately 0.0008., about 6000 angstroms of in-situ phosphorus doped polysilicon is deposited across the memory array 12. In doing so, the trenches are completely filled with polysilicon of uniform doping. Thereafter, the polysilicon across the array is thinned by etching it back to a thickness of about 3000Å.

Figure 18:
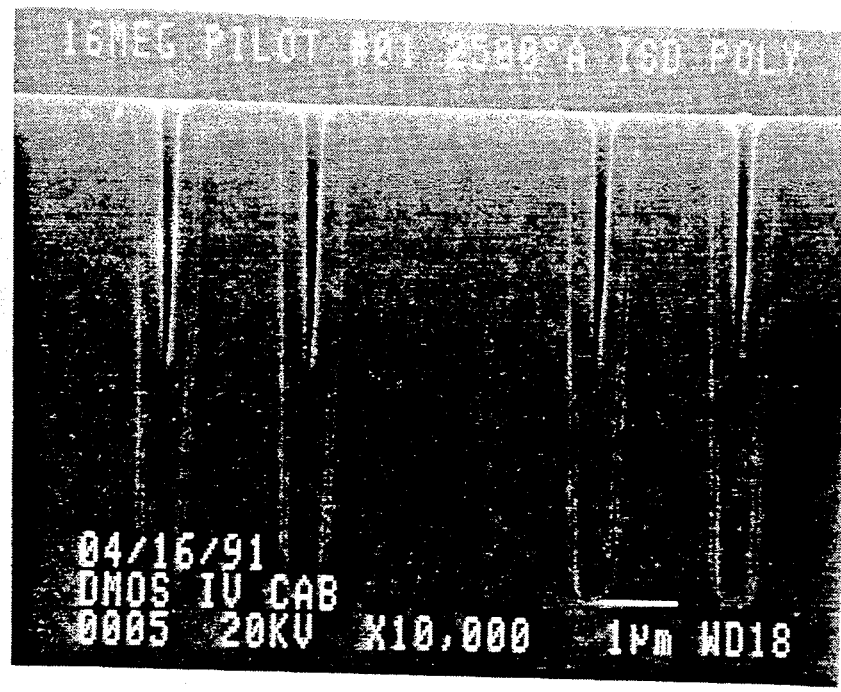
FIG. 18 depicts a SEM micrograph of a trench memory array partially filled with in-situ doped polysilicon according to the method of the invention.
Figure 19:
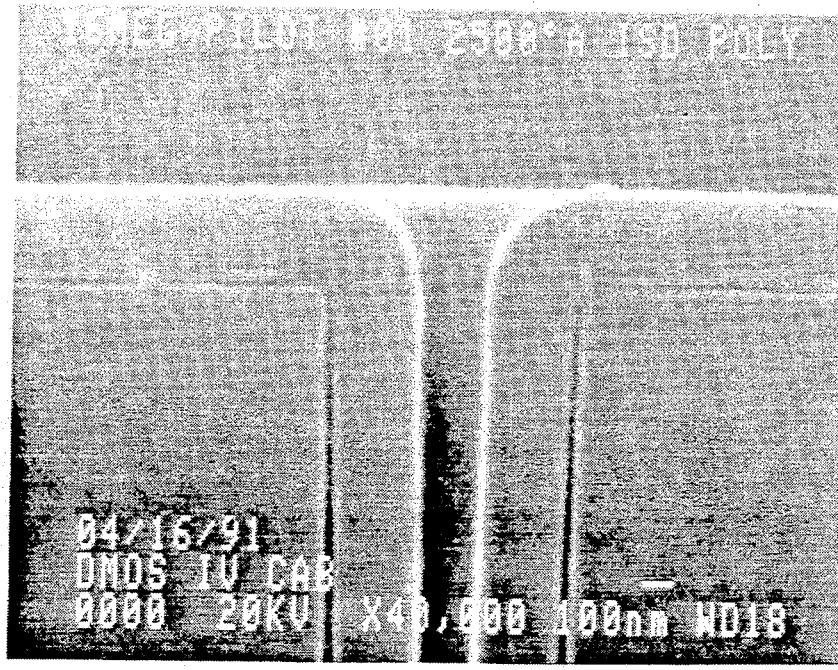
FIG. 19 depicts an enlarged SEM micrograph of a trench of FIG. 18.

FIG. 18 is representative of a Scanning Electron Microscopy, SEM, micrograph of a 16M trench capacitor memory array filled with 2500Å of in-situ doped polysilicon according to the preferred embodiment of the invention. The trenches are high aspect ratio having a size of about 0.6 microns wide×6.0 microns deep. FIG. 19 is an enlarged SEM view of a trench of FIG. 18. Note that the in-situ doped polysilicon, ISD poly, has virtually the same thickness on the inside of the trench walls as it has across the array and thus in highly conformal and provides excellent step coverage. The inventive process yields a high degree of conformality with a step coverage greater than about 95%.

The process of the invention has broad applicability to in-situ doped silicon films. Although the formation of the polysilicon field plate of the memory device was described above, the bit lines of the device can be formed by this process by using a thin ISD poly layer that is silicided after patterning it. The polysilicon gates of the transfer transistors can be formed by this process as well.

While phosphine PH3 is the preferred embodiment for the phosphorus dopant source, other suitable sources include tertiary butyl phosphine and organophosphorus sources such as, isobutyl phosphine, trimethyl phosphate, tetramethyl phosphate, and phosphorus trichloride. It is believed that arsine AsH3 will work as a suitable arsenic source. Other organoarsenic compounds should work as well.

The process of the invention is particularly suited for high aspect ratio trench technology that requires films be uniform, defect free, highly conformal, and provide good step coverage. The films produced by the inventive technique are of sufficient conformality and resistivity to meet VLSI requirements and are manufactured with low temperature, low pressure, and low dopant concentration. The process is suited for high throughput of semiconductor wafers.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of forming a layer of doped silicon, comprising the steps of:
    heating a reaction chamber to a temperature of 540-570 degrees centigrade;
    evacuating the reaction chamber to a pressure of 200-200 mTorr; and
    introducing a ratio of dopant source/silane of about 0.0008 into the reaction chamber.

2. The method of claim 1 wherein the temperature in the reaction chamber is approximately 560° C.

3. The method of claim 1 wherein the pressure within the reaction chamber is approximately 300 l mTorr.

4. The method of claim 1 wherein the dopant source is phosphorus.

5. The method of claim 4 wherein the phosphorus dopant source comprises phosphine.

6. The method of claim 1 wherein the temperature in the reaction chamber is approximately 560° C., the pressure within the reaction chamber is approximately 300 mTorr, the dopant source is phosphine, and the phosphine,/silane ratio is approximately 0.0008.

7. The method of claim 1 wherein the dopant source is arsenic.

8. A method of depositing a phosphorus doped silicon film on a surface, comprising the steps of:
    disposing the surface within a reactor;
    heating the surface to a temperature of 540-570 degrees centigrade;
    pumping to a pressure of 200-400 mTorr within the reactor;
    introducing silane and phosphine into the reactor in a ratio of phosphine to silane of 0.0008 to 0.002 so that phosphorus doped silicon is deposited on the substrate.

9. The method of claim 8 wherein the surface is heated to a temperature of about 560° C.

10. The method of claim 9 wherein the pressure is pumped to about 300 mTorr.

11. The method of claim 10 wherein the phosphorus dopant is phosphine and the ratio of phosphine to silane is about 0.0008.

12. The method of claim 8, further comprising:
prior to the step of disposing said surface in a reactor, forming a trench into said surface, so that said silicon layer is deposited into said trench.

13. The method of in-situ doping deposited silicon, comprising the steps of:
reacting silane and a dopant over a semiconductor substrate at a temperature of about 560° C. and a pressure of about 300 mTorr; to deposit a doped silicon on the substrate; wherein the ratio of dopant to silane is 0.0008 to 0.002.

14. The method of claim 13 wherein the ratio of the dopant to silane is about 0.0008.

15. The method of claim 13 wherein the dopant is phosphorus.

16. The method of claim 13 wherein the dopant is arsenic.

17. The method of claim 13 wherein the silicon is polysilicon.

* * * * *